United States Patent
Jain et al.

(10) Patent No.: US 11,003,818 B1
(45) Date of Patent: May 11, 2021

(54) RANGE COMPUTATION OF BITWISE OPERATORS

(71) Applicant: Xilinx, Inc., San Jose, CA (US)

(72) Inventors: Ashish Kumar Jain, Hyderabad (IN); Saikat Bandyopadhyay, San Jose, CA (US); Jason Villarreal, Los Gatos, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/790,578

(22) Filed: Feb. 13, 2020

(51) Int. Cl.
*G06F 30/00* (2020.01)
*G06F 30/33* (2020.01)
*G06F 9/30* (2018.01)
*G06F 30/3308* (2020.01)
*G06F 7/499* (2006.01)

(52) U.S. Cl.
CPC .......... *G06F 30/33* (2020.01); *G06F 7/49942* (2013.01); *G06F 9/30018* (2013.01); *G06F 9/30029* (2013.01); *G06F 30/3308* (2020.01)

(58) Field of Classification Search
CPC .. G06F 30/33; G06F 30/3308; G06F 9/30029; G06F 9/30018; G06F 7/49942
See application file for complete search history.

(56) References Cited

U.S. PATENT DOCUMENTS

| | | | | |
|---|---|---|---|---|
| 6,175,946 B1* | 1/2001 | Ly | ............... | G06F 30/33 716/103 |
| 6,215,327 B1* | 4/2001 | Lyke | ............... | H03K 19/17796 326/10 |
| 6,606,588 B1* | 8/2003 | Schaumont | ............... | G06F 30/30 703/15 |
| 7,006,960 B2* | 2/2006 | Schaumont | ............... | G06F 30/30 703/15 |
| 7,512,912 B1* | 3/2009 | Iyer | ............... | G01R 31/318371 716/136 |
| 8,484,511 B2* | 7/2013 | Tidwell | ............... | H04N 21/458 714/15 |
| 8,495,122 B2* | 7/2013 | Simkins | ............... | H03K 19/17732 708/523 |
| 2020/0005744 A1* | 1/2020 | Godunov | ............... | G10H 1/0025 |

* cited by examiner

*Primary Examiner* — Naum Levin
(74) *Attorney, Agent, or Firm* — Amir Tabarrok; Rimon Law (57) ABSTRACT

A method includes parsing and compiling a software code that includes a constraint bitwise operation with a first operand associated with a first constraint range and a second operand associated with a second constraint range. A first and a second plurality of ranges that spans the first and second constraint range are generated. In some embodiments, each constrained range is converted into a binary format having an upper bit portion and a lower bit portion. The upper bit portion for the each range remains unchanged. A resultant range associated with the constraint bitwise operation is determined based on performing the constraint bitwise operation on the first and the second plurality of ranges.

20 Claims, 10 Drawing Sheets

Lower Bound = 100  ⇒ 1100100 (7-bit)
Upper Bound = 200  ⇒ 11001000 (8-bit)

FIGURE 1A

| Sl.No. | Range in Binary Notation | Range in Decimal | General Binary expression for Range |
|---|---|---|---|
| ① | [1100100:1100111] | [100 – 103] | [11001**] |
| ② | [1101000:1101111] | [104 – 111] | [1101***] |
| ③ | [1110000:1111111] | [112 – 127] | [111****] |
| ④ | [10000000:10111111] | [128 – 191] | [10******] |
| ⑤ | [11000000:11000111] | [192 – 199] | [11000***] |
| ⑥ | [11001000:11001000] | [200 – 200] | [11001000] |

FIGURE 1B

| Iteration Number | Ranges used (Sl.no.) | General Expression for Resultant Range | Ranges in Decimal (Conquer Step) | Cumulative Ranges (Combine Step) |
|---|---|---|---|---|
| 1 | ① & ① | r [ 1101** ] | [100:103] | [100:103] |
| 2 | ① & ② | r [ 1100*** ] | [96:103] | [96:103] |
| 3 | ① & ③ | r [ 1100**** ] | [96:103] | [96:103] |
| 4 | ① & ④ | r [ 00*00**** ] | [0:7][32:39] | [0:7][32:39][96:103] |
| 5 | ① & ⑤ | r [ 01000*** ] | [64:71] | [0:7][32:39][64:71][96:103] |
| 6 | ① & ⑥ | r [ 1000000 ] | [64:64] | [0:7][32:39][64:71][96:103] |
| 7 | ② & ② | r [ 1101*** ] | [104:111] | [0:7][32:39][64:71][96:111] |
| 8 | ② & ③ | r [ 110**** ] | [96:111] | [0:7][32:39][64:71][96:111] |
| 9 | ② & ④ | r [ 00*0**** ] | [0:15][32:47] | [0:15][32:47][64:71][96:111] |
| 10 | ② & ⑤ | r [ 01000*** ] | [64:71] | [0:15][32:47][64:71][96:111] |
| 11 | ② & ⑥ | r [ 1001000 ] | [72:72] | [0:15][32:47][64:72][96:111] |
| 12 | ③ & ③ | r [ 111**** ] | [112:127] | [0:15][32:47][64:72][96:127] |
| 13 | ③ & ④ | r [ 00****** ] | [0:63] | [0:15][32:47][64:72][96:127] |
| 14 | ③ & ⑤ | r [ 01000*** ] | [64:71] | [0:15][32:47][64:72][96:127] |
| 15 | ③ & ⑥ | r [ 0100*000 ] | [64:64][72:72] | [0:15][32:47][64:72][96:127] |
| 16 | ④ & ④ | r [ 10****** ] | [128:191] | [0:72][96:191] |
| 17 | ④ & ⑤ | r [ 1000**** ] | [128:135] | [0:72][96:191] |
| 18 | ④ & ⑥ | r [ 1000*000 ] | [128:128][136:136] | [0:72][96:191] |
| 19 | ⑤ & ⑤ | r [ 11000*** ] | [192:199] | [0:72][96:199] |
| 20 | ⑤ & ⑥ | r [ 11000000 ] | [192:192] | [0:72][96:199] |
| 21 | ⑥ & ⑥ | r [ 11001000 ] | [200:200] | [0:72][96:200] |

FIGURE 2

| Iteration Number | Ranges used (Sl.no.) | General Expression for Resultant Range | Ranges in Decimal (Conquer Step) | Cumulative Ranges (Combine Step) |
|---|---|---|---|---|
| 1 | ①\|① | r[ 11001** ] | [100:103] | [100:103] |
| 2 | ①\|② | r[ 11011** ] | [108:111] | [100:103] [108:111] |
| 3 | ①\|③ | r[ 111*1** ] | [116:119][124:127] | [100:103] [108:111] [116:119][124:127] |
| 4 | ①\|④ | r[ 111*1 ] | [228:231][236:239][244:255] | [100:103] [108:111] [116:119][124:127] [228:231][236:239][244:255] |
| 5 | ①\|⑤ | r[ 111001** ] | [228:231] | [100:103] [108:111] [116:119][124:127] [228:231][236:239][244:255] |
| 6 | ①\|⑥ | r[ 1110100 ] | [236:236] | [100:103] [108:111] [116:119][124:127] [228:231][236:239][244:255] |
| 7 | ②\|② | r[ 1101*** ] | [104:111] | [100:111] [116:119][124:127] [228:231][236:239][244:255] |
| 8 | ②\|③ | r[ 1101*** ] | [120:127] | [100:111] [116:127] [228:231][236:239][244:255] |
| 9 | ②\|④ | r[ 111*1*** ] | [232:239][248:255] | [100:111] [116:127] [228:239][244:255] |
| 10 | ②\|⑤ | r[ 11101*** ] | [232:239] | [100:111] [116:127] [228:239][244:255] |
| 11 | ②\|⑥ | r[ 11101*** ] | [232:239] | [100:111] [116:127] [228:239][244:255] |
| 12 | ③\|③ | r[ 111**** ] | [112:127] | [100:127] [228:239][244:255] |
| 13 | ③\|④ | r[ 11111*** ] | [240:255] | [100:127] [228:255] |
| 14 | ③\|⑤ | r[ 11111*** ] | [240:255] | [100:127] [228:255] |
| 15 | ③\|⑥ | r[ 11111*** ] | [248:255] | [100:127] [228:255] |
| 16 | ④\|④ | r[ 10****** ] | [128:191] | [100:191] [228:255] |
| 17 | ④\|⑤ | r[ 11****** ] | [192:255] | [100:255] |
| 18 | ④\|⑥ | r[ 111* ] | [200:207][216:223][232:239][248:255] | [100:255] |
| 19 | ⑤\|⑤ | r[ 11000*** ] | [192:199] | [100:255] |
| 20 | ⑤\|⑥ | r[ 11101*** ] | [232:239] | [100:255] |
| 21 | ⑥\|⑥ | r[ 11001000 ] | [200:200] | [100:255] |

FIGURE 3

| Iteration Number | Ranges used (Sl.no.) | General Expression for Resultant Range | Ranges in Decimal (Conquer Step) | Cumulative Ranges (Combine Step) |
|---|---|---|---|---|
| 1 | ① ∧ ① | r[ 000000** ] | [0:3] | [0:3] |
| 2 | ① ∧ ② | r[ 0001**** ] | [8:15] | [0:3] [8:15] |
| 3 | ① ∧ ③ | r[ 001***** ] | [16:31] | [0:3] [8:31] |
| 4 | ① ∧ ④ | r[ 11****** ] | [192:255] | [0:3] [8:31] [192:255] |
| 5 | ① ∧ ⑤ | r[ 10100*** ] | [160:167] | [0:3] [8:31][160:167] [192:255] |
| 6 | ① ∧ ⑥ | r[ 101011** ] | [172:175] | [0:3] [8:31][160:167] [172:175] [192:255] |
| 7 | ② ∧ ② | r[ 0000*** ] | [0:7] | [0:31][160:167] [172:175] [192:255] |
| 8 | ② ∧ ③ | r[ 001***** ] | [16:31] | [0:31][160:167] [172:175] [192:255] |
| 9 | ② ∧ ④ | r[ 11****** ] | [192:255] | [0:31][160:167] [172:175] [192:255] |
| 10 | ② ∧ ⑤ | r[ 10101*** ] | [168:175] | [0:31][160:175] [192:255] |
| 11 | ② ∧ ⑥ | r[ 10100*** ] | [160:167] | [0:31][160:175] [192:255] |
| 12 | ③ ∧ ③ | r[ 000***** ] | [0:15] | [0:31][160:175] [192:255] |
| 13 | ③ ∧ ④ | r[ 11****** ] | [192:255] | [0:31][160:175] [192:255] |
| 14 | ③ ∧ ⑤ | r[ 1011**** ] | [176:191] | [0:31][160:255] |
| 15 | ③ ∧ ⑥ | r[ 1011**** ] | [176:191] | [0:31][160:255] |
| 16 | ④ ∧ ④ | r[ 00****** ] | [0:63] | [0:63][160:255] |
| 17 | ④ ∧ ⑤ | r[ 01****** ] | [64:127] | [0:127][160:255] |
| 18 | ④ ∧ ⑥ | r[ 01****** ] | [64:127] | [0:127][160:255] |
| 19 | ⑤ ∧ ⑤ | r[ 00000*** ] | [0:7] | [0:127][160:255] |
| 20 | ⑤ ∧ ⑥ | r[ 00001*** ] | [8:15] | [0:127][160:255] |
| 21 | ⑥ ∧ ⑥ | r[ 0 ] | [0:0] | [0:127][160:255] |

FIGURE 4

| Iteration Number | Ranges used (Sl.no.) | General Expression for Resultant Range | Ranges in Decimal (Conquer Step) | Cumulative Ranges (Combine Step) |
|---|---|---|---|---|
| 1 | 1 ^ 1 | r[ [1111 1**  ] | [124:127] | [124:127] |
| 2 | 1 ^ 2 | r[ [1110 **** ] | [112:119] | [112:119] [124:127] |
| 3 | 1 ^ 3 | r[ [110  **** ] | [96:111]  | [96:119] [124:127] |
| 4 | 1 ^ 4 | r[ [00   **** ] | [0:63]    | [0:63] [96:119] [124:127] |
| 5 | 1 ^ 5 | r[ [01011 *** ] | [88:95]   | [0:63] [88:119] [124:127] |
| 6 | 1 ^ 6 | r[ [01010 *** ] | [80:83]   | [0:63] [80:83] [88:119] [124:127] |
| 7 | 2 ^ 2 | r[ [1111 1*** ] | [120:127] | [124:127] |
| 8 | 2 ^ 3 | r[ [110  **** ] | [96:111]  | [0:63] [80:83] [88:127] |
| 9 | 2 ^ 4 | r[ [00   **** ] | [0:63]    | [0:63] [80:83] [88:127] |
| 10 | 2 ^ 5 | r[ [01010 *** ] | [80:87]  | [0:63] [80:127] |
| 11 | 2 ^ 6 | r[ [01011 *** ] | [88:95]  | [0:63] [80:127] |
| 12 | 3 ^ 3 | r[ [111  **** ] | [0:15]   | [0:63] [80:127] |
| 13 | 3 ^ 4 | r[ [00   **** ] | [0:63]   | [0:63] [80:127] |
| 14 | 3 ^ 5 | r[ [0100 **** ] | [64:79]  | [0:127] |
| 15 | 3 ^ 6 | r[ [0100 **** ] | [64:79]  | [0:127] |
| 16 | 4 ^ 4 | r[ [11   **** ] | [192:255]| [0:127] [192:255] |
| 17 | 4 ^ 5 | r[ [10   **** ] | [128:191]| [0:255] |
| 18 | 4 ^ 6 | r[ [10   **** ] | [128:191]| [0:255] |
| 19 | 5 ^ 5 | r[ [11111 *** ] | [248:255]| [0:255] |
| 20 | 5 ^ 6 | r[ [11110 *** ] | [240:247]| [0:255] |
| 21 | 6 ^ 6 | r[ [11111 111 ] | [255:255]| [0:255] |

FIGURE 5

| Iteration Number | Ranges used (Sl.no.) | General Expression for Resultant Range | Ranges in Decimal (Conquer Step) | Cumulative Ranges (Combine Step) |
|---|---|---|---|---|
| 1 | ① | r [ 00110** ] | [24:27] | [24:27] |
| 2 | ② | r [ 0010*** ] | [16:23] | [16:27] |
| 3 | ③ | r [ 000**** ] | [0:15] | [0:27] |
| 4 | ④ | r [ 01****** ] | [64:127] | [0:27][64:127] |
| 5 | ⑤ | r [ 00111*** ] | [56:63] | [0:27][56:127] |
| 6 | ⑥ | r [ 00110111 ] | [55:55] | [0:27][55:127] |

RANGE COMPUTATION OF BITWISE OPERATORS

TECHNICAL FIELD

The disclosure generally relates to bitwise operators and more particularly to range computation of bitwise operators.

BACKGROUND

Typically, bitwise operators may be used for testing the operation of a chip, e.g., programmable chip. It is appreciated that often a value may be selected from a valid range to test the operation of a chip. Traditionally, determining the resultant range of the bitwise operation output is done through brute force and is therefore not only a complicated process but also a time-consuming one. For example, traditionally to obtain the resultant range, each value within a valid range is selected to obtain its resultant value and the process is repeated to obtain the entire resultant range.

It is appreciated that the resultant range may not necessary be the same or within the same range as the range of its operators. For example, a bitwise operation for an AND operation of two operands, one within a range of 100-200 and another within a range of 300-500 can generate a resultant range of 400-700.

SUMMARY

Accordingly, it is desirable to compute the resultant range of operation of bitwise operators, e.g., AND, OR, XOR, XNOR, NEGATION, etc., in an efficient and timely manner. Instead of a brute-force approach that requires every possible combination, a more efficient approach is desired to reduce the number of computations and the amount of time required to obtain the resultant range.

In some embodiments, a computer implemented method includes parsing a software code that includes a constraint bitwise operation with a first operand associated with a first constraint range and a second operand associated with a second constraint range. The parsed software code is compiled. A first plurality of ranges that spans the first constraint range is generated. In some embodiments, each constrained range is converted into a binary format. Each range of the first plurality of ranges has an upper bit portion and a lower bit portion. The upper bit portion for the each range of the first plurality of ranges remains unchanged. A second plurality of ranges that spans the second constraint range is generated. Each range of the second plurality of ranges has an upper bit portion and a lower bit portion. The upper bit portion for the each range of the second plurality of ranges remains unchanged. A resultant range associated with the constraint bitwise operation is determined based on performing the constraint bitwise operation on the first and the second plurality of ranges. It is appreciated that a number of ranges within a plurality of ranges is substantially smaller than the number of values within each valid range. Therefore, constructing plurality of ranges and performing bitwise operation on the constructed ranges rather than each value within the valid range to determine the resultant range is much more time efficient and computationally less intensive than the traditional brute force approach.

It is appreciated that in some embodiments, the first constraint range is different from the second constraint range. According to some embodiments, the constraint bitwise operation is a logical operation, e.g., AND operation, an OR operation, an XOR operation, an XNOR operation, a negation operation, etc. In some nonlimiting examples, the software code is in a system Verilog format.

It is appreciated that in some embodiments, the upper bit portion of one range of the first plurality of ranges is different from the upper bit portion of another range of the first plurality of ranges. In one nonlimiting example, a number of bits in the upper bit portion of the one range of the first plurality of ranges is different from a number of bits in the upper bit portion of the another range of the first plurality of ranges. In some nonlimiting examples, a number of bits in the upper bit portion of the one range of the first plurality of ranges is the same as a number of bits in the upper bit portion of the another range of the first plurality of ranges.

In some embodiments, the determining the resultant range may include performing the constraint bitwise operation between each range from the first plurality of ranges and each range from the second plurality of ranges to generate a plurality of subset ranges that forms the resultant range. Accordingly, the each subset range of the plurality of subset ranges includes a first bit portion and a second bit portion. It is appreciated that the first bit portion remains unchanged for that subset range. In some nonlimiting examples, the first bit portion of a subset range of the plurality of subset ranges is different from the first bit portion of another subset range of the plurality of subset ranges. It is appreciated that in some nonlimiting examples the first bit portion of a subset of the plurality of subset ranges includes consecutive bit orders. In some embodiments, the first bit portion of a subset of the plurality of subset ranges includes nonconsecutive bit orders. According to some embodiments, a number of bits in the first bit portion of a subset range of the plurality of subset ranges is different from a number of bits in the first bit portion of another subset range of the plurality of subset ranges. According to one nonlimiting example, the first bit portion of a subset range of the plurality of subset ranges includes at least one bit order that is absent from the first bit portion of another subset range of the plurality of subset ranges.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Examples described herein relate to bitwise operators and to determining the resultant range of the constraint bitwise operation in a time-efficient manner. In practice, a random value may be selected from a valid range for that operand and a bitwise operation is performed. In some nonlimiting examples, a software code, e.g., system Verilog format, is parsed and compiled. The bitwise operators of the software code may be a logical operation, e.g., a logical AND, a logical OR, a logical XOR, a logical XNOR, a logical NEGATION, etc. The proposed approach converts the valid range for each operand, e.g., from a decimal format, to a binary format. Furthermore, a plurality of ranges that spans each valid range (in binary) of an operand is constructed. It is appreciated that a number of bits within each constructed range remains unchanged for the entire constructed range, e.g., bit order 1, 2, and 3, may remain unchanged while bit orders 4, 5, 6, 7, and 8 may change for a constructed range.

Once a plurality of ranges for each valid range of an operand is constructed, the bitwise operation is performed for every possible combination of the constructed ranges, which includes far fewer combinations than the brute force method that requires a combination for every element within the valid range. The resultant range is therefore determined. It is appreciated that since fewer combinations are used in determining the resultant range in comparison to the traditional brute force approach, the resultant range is calculated much faster and is therefore much more efficient in comparison to the traditional brute force approach.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. For example, various methods according to some examples can include more or fewer operations, and the sequence of operations in various methods according to examples may be different than described herein. In addition, an illustrated example need not have all the aspects or advantages shown. An aspect or an advantage described in conjunction with a particular example is not necessarily limited to that example and can be practiced in any other examples even if not so illustrated or if not so explicitly described.

Some general concepts will first be described to clarify terms and nomenclature used throughout this description.

Figure 1A:
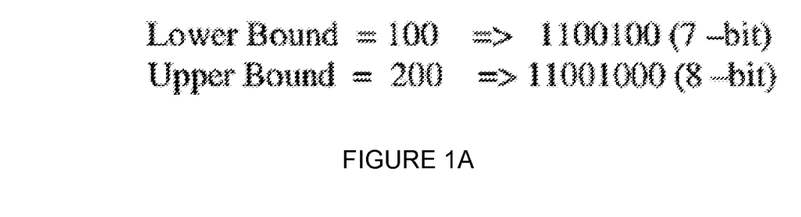
FIG. 1A shows a table depicting transformation of a lower and upper bound for a constraint range of an operand to a binary format, according to some examples.

FIG. 1A shows a table depicting transformation of a lower and upper bound for a valid range of an operand to a binary format, according to some examples. For illustrative purposes it is presumed that the bitwise operation includes two operands with the same valid range. It is appreciated that although a single continuous range is described, the embodiments should not be construed as limited thereto. For example, a valid range for an operand may include a plurality of continuous ranges. Moreover, two operands may be described as having the same valid range for illustrative purposes but it is appreciated that their ranges may be different from one another and the embodiments should not be construed as limited thereto.

Furthermore, it is appreciated that although the examples are described with respect to either one or two operands, the embodiments are not limited thereto and any number of operands with their respective valid ranges may be used. It is appreciated that the term valid range and constraint range are used interchangeably throughout the application.

In some embodiments, the bitwise operation includes two operands, e.g., "a" and "b". The "a" operand may have a valid range of [a1:a2] where a1 is the lower bound for the valid range and a2 is the upper bound for the valid range. Similarly, "b" operand may have a valid range of [b1:b2] where b1 is the lower bound for the valid range and b2 is the upper bound for the valid range. The complexity for the traditional brute force process is O((a2−a1)*(b2−b1)). Accordingly, the complexity grows for large simulation causing the simulation to hang or take a long time to compute.

In this illustrative example it is presumed that the lower bound a1 for the operand "a" is 100 and its upper bound a2 is 200. For illustrative purposes it is also presumed that the lower bound b1 and the upper bound b2 of the operand "b" are also the same as operand a, hence having a lower bound 100 and an upper bound 200.

The range for each operand is converted into a binary format. It is appreciated that in this nonlimiting example the range is in decimal format and is converted into a binary format. The lower bound 100 in decimal format is 1100100 in binary format and the upper bound 200 in decimal format is 11001000 in binary format.

Figure 1B:
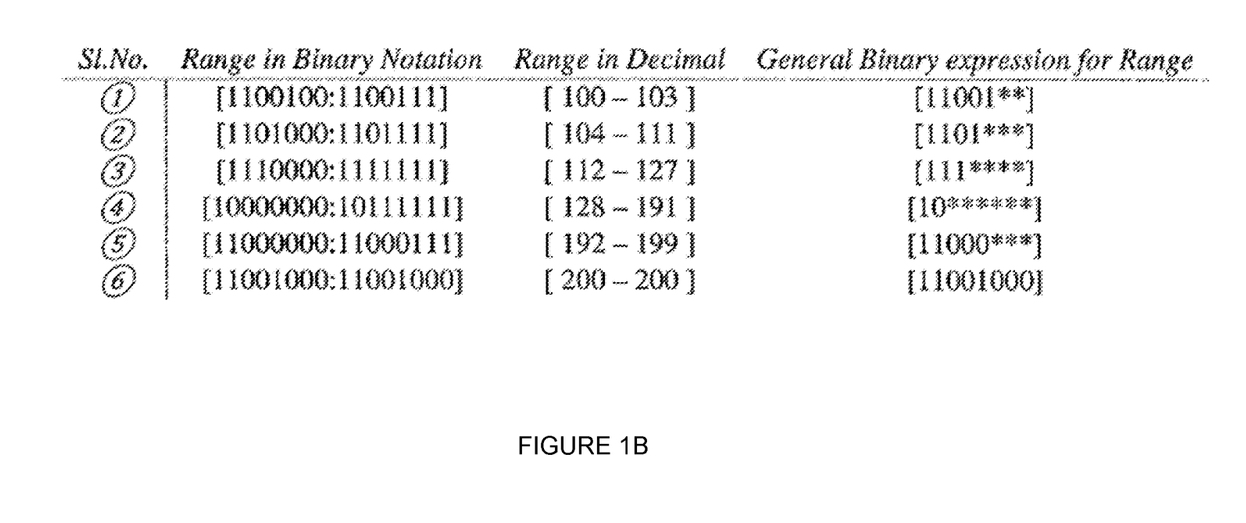
FIG. 1B shows a table depicting construction of a plurality of ranges for each constraint range of an operand, according to some examples.

FIG. 1B shows a table depicting construction of a plurality of ranges for each constraint range of an operand, according to some examples. The constraint ranges from 1100100 to 11001000 may form a plurality of ranges, as illustrated. It is appreciated that a pattern emerges when the constraint range is illustrated in a binary format. For example, 100 in decimal format is 1100100 in binary format, 101 in decimal format is 1100101 in binary format, 102 in decimal format is 1100110 in binary format, 103 in decimal format is 1100111 in binary format. The pattern in the illustrated example is that the five most significant bit orders for the range are the same whereas the least two significant bit orders change, which can be illustrated as 11001XX. Similarly, other ranges can similarly be constructed. For example, decimal numbers 104-111 result in the most four significant bit orders being the same, hence 1101, and where their least three significant bit orders change, which can be illustrated as 1101XXX. It is appreciated that other ranges are similarly construed. For example, decimal numbers 112-127 result in 111XXXX, 128-191 results in 10XXXXXX, 192-199 results in 11000XXX, and 200 results in 11001000. Accordingly, the constraint range is converted into a plurality of ranges that spans the constraint range. As such, instead of 101 combinations that span 100-200 only 6 range combinations are needed to compute the resultant range, thereby significantly reducing the amount of time as well as the complexity. It is appreciated that in some embodiments the same constraint range may construct fewer or more ranges and that the number of ranges discussed is for illustrative purposes only and should not be construed as limiting the scope of the embodiments. For example, the first range represented by 11001XX may be split into two ranges such as 110011X and 1100100. As such, the ranges, as described are for illustrative purposes and should not be construed as limiting the scope of the embodiments.

As illustrated, the upper bit portion of one range is different from the upper bit portion of another range that is construed. For example, a number of bits in the upper bit portions vary from 2 in range 4 to 8 in range 6, as illustrated. Moreover, even ranges with the same number of upper bits portion may have different values, e.g., range 1 has upper bit portion 11001 whereas range 5 has 11000 as its upper bit portion.

Figure 2:
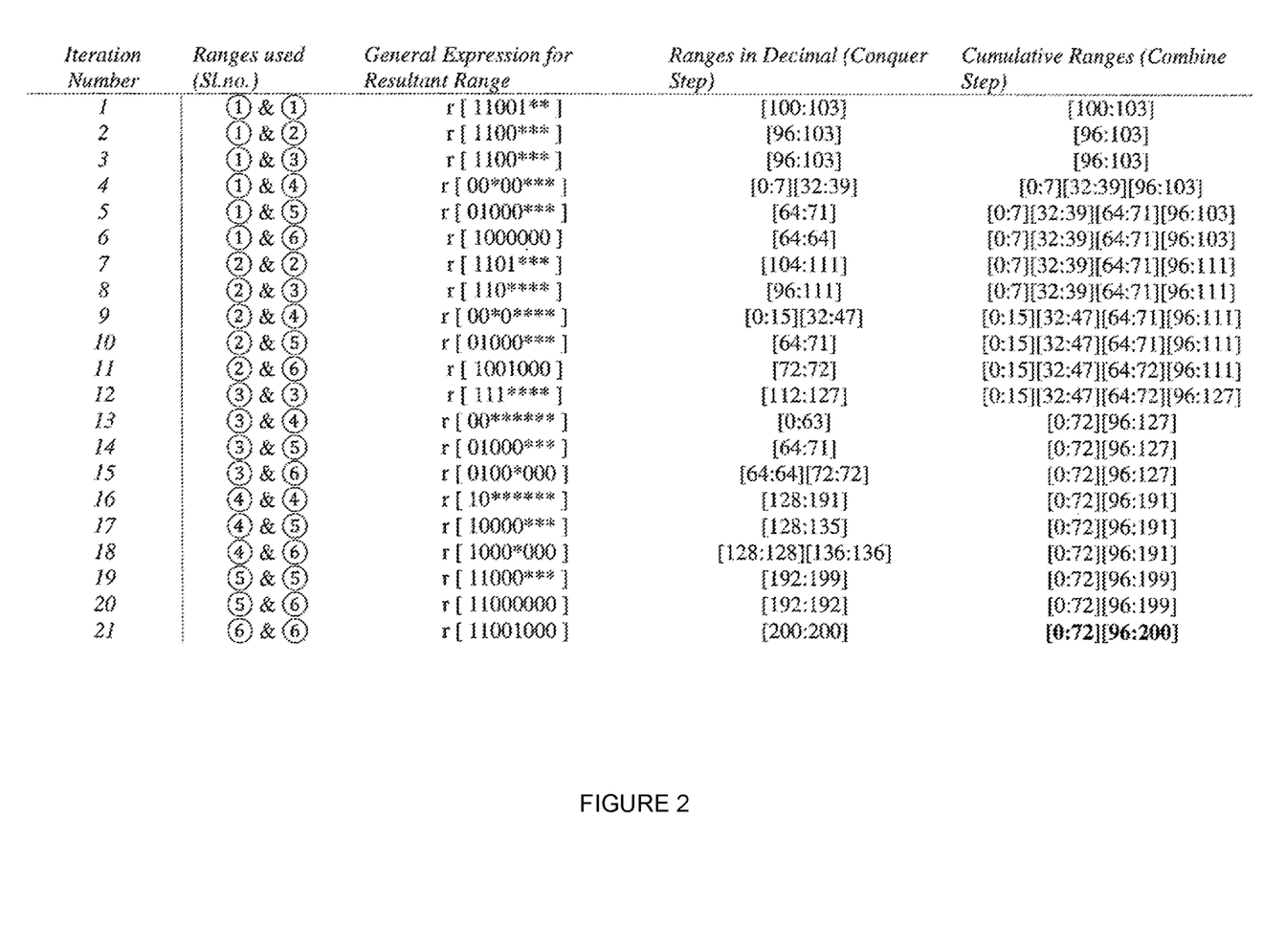
FIG. 2 shows a table depicting a bitwise AND operation based on the constructed ranges associated with operands of the bitwise AND operation, according to some embodiments.

FIG. 2 shows a table depicting a bitwise AND operation based on the constructed ranges associated with operands of the bitwise AND operation, according to some embodiments. The software code for a bitwise AND operation with a constraint may be represented below:
class D;
rand int a;
rand in b;
rand int r;
constraint c (r==a & b;) //"&" operator can be replaced with "|" or "^" as well endclass
module top( );
D obj=new;
initial obj.randomize( );
endmodule It is appreciated that while in the illustrative example the variable of integer type is used, any other variable type may be used and the use of an integer is for illustrative purposes and should not be construed as limiting the scope of the embodiments. For example, data types with longint type, bit type, etc., may similarly be used. It is appreciated that "r" represents the resultant range.

In contrast to the code above, a brute force methodology may have a code as shown below:
Range r;
for(int i=a1; i<=a2; i++) // runs n times where n=a2-a1
{
  for(int j=b1; j<=b2; j++) // runs m times where m=b2-b1
  {
  //Compute (i & j) and store it in r; // Constant time computation
  }
}

Accordingly, the time complexity of the brute force algorithm may be O (m*n). Instead of obtaining the resultant range using brute force that has substantially higher time complexity, the embodiments use the constructed ranges instead for the bitwise operations. For example, the constructed ranges, as shown in FIG. 1B, are used for every possible combination of an AND bitwise operation to obtain the resultant range. For example, using the first range 11001XX for the first operand with the first range of the second operand, which is the same in this case because both constraint ranges of the operands "a" and "b" were selected to be the same for illustrative and nonlimiting purposes. Accordingly, the resultant range for the bitwise AND operation for the combination for range 11001XX and 11001XX results in a 11001XX resultant subset. On the other hand, the bitwise AND operation combination of the first range for the "a" operand and the second range for the "b" operand, hence 11001XX and 1101XXX respectively, results in a 11000XXX resultant subset. Similarly, the bitwise AND operation combination of the first range for the "a" operand and the third range for the "b" operand, hence 11001XX and 111XXXX respectively, results in a 11000XXX resultant subset. It is appreciated that the process is repeated for every possible combination for the constructed ranges in FIG. 1B. Accordingly, the table, as shown in FIG. 2, is constructed. The resultant range in decimal format may therefore be determined to be [0:72] and [96:200].

It is appreciated that the first bit portion of the resultant subset refers to bit orders with a value and a second bit portion of the resultant subset refers to bit orders with "DON'T CARE" values, hence X. It is appreciated that as illustrated, a first bit portion of one subset resultant range may be different from the first bit portion of another subset resultant range. For example, the first bit portion of iteration 1 are the five most significant bit orders having a value of 11001 whereas the first bit portion of iteration 4 is the two most significant bit orders having a value of 00 separated by a second bit portion of "DON'T CARE", hence X, followed by two more consecutive bit orders having a value of 00. As illustrated, the first bit portion for each subset resultant range may include consecutive bit orders, e.g., iterations 1-21, or nonconsecutive, e.g., iteration 4, 9, and 18. Furthermore, it is appreciated that the number of bits in the first bit portion for each subset resultant range may be the same, e.g., iterations 2-4, and 7 each having 4 bits, or may be different, e.g., iteration 1 having five bits and iteration 2 having 4 bits. It is furthermore appreciated that a bit order may be present in one subset resultant range but be absent in another subset resultant range, e.g., iteration 12 has a third most significant bit value of 1 whereas in iteration 13, the third most significant bit order is absent because it has a "DON'T CARE" value, hence X.

Figure 3:
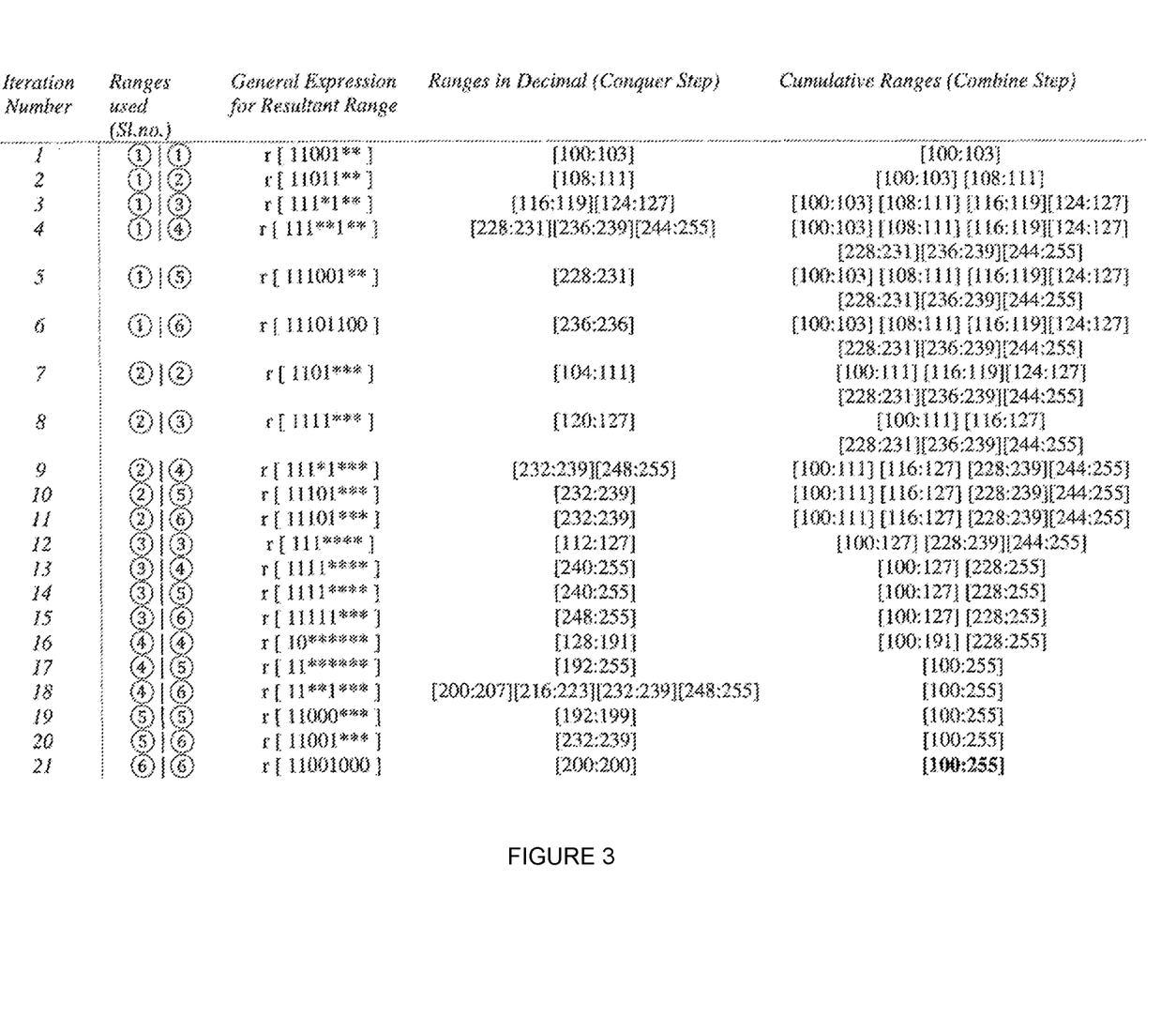
FIG. 3 shows a table depicting a bitwise OR operation based on the constructed ranges associated with operands of the bitwise OR operation, according to some examples.

FIG. 3 shows a table depicting a bitwise OR operation based on the constructed ranges associated with operands of the bitwise OR operation, according to some examples. The construed ranges, as shown in FIG. 1B, are used for every possible combination of an OR bitwise operation to obtain the resultant range. For example, using the first range 11001XX for the first operand with the first range of the second operand, which is the same in this case because both constraint ranges of the operands "a" and "b" were selected to be the same for illustrative and nonlimiting purposes. Accordingly, the resultant range for the bitwise OR operation for the combination for range 11001XX and 11001XX results in a 11001XX resultant subset. On the other hand, bitwise OR operation combination of first range for the "a" operand and the second range for the "b" operand, hence 11001XX and 1101XXX respectively, results in a 11011XX resultant subset. Similarly, the bitwise OR operation combination of the first range for the "a" operand and the third range for the "b" operand, hence 11001XX and 111XXXX respectively, results in a 111X1XX resultant subset. It is appreciated that the process is repeated for every possible combination for the constructed ranges in FIG. 1B. Accordingly, the table, as shown in FIG. 3, is constructed. The resultant range in decimal format may therefore be determined to be [100:255]. It is appreciated that similar to FIG. 2, the first bit portion of the subset of the resultant range may have consecutive bit orders, nonconsecutive bit orders, a different number of bits, different bit values, etc.

Figure 4:
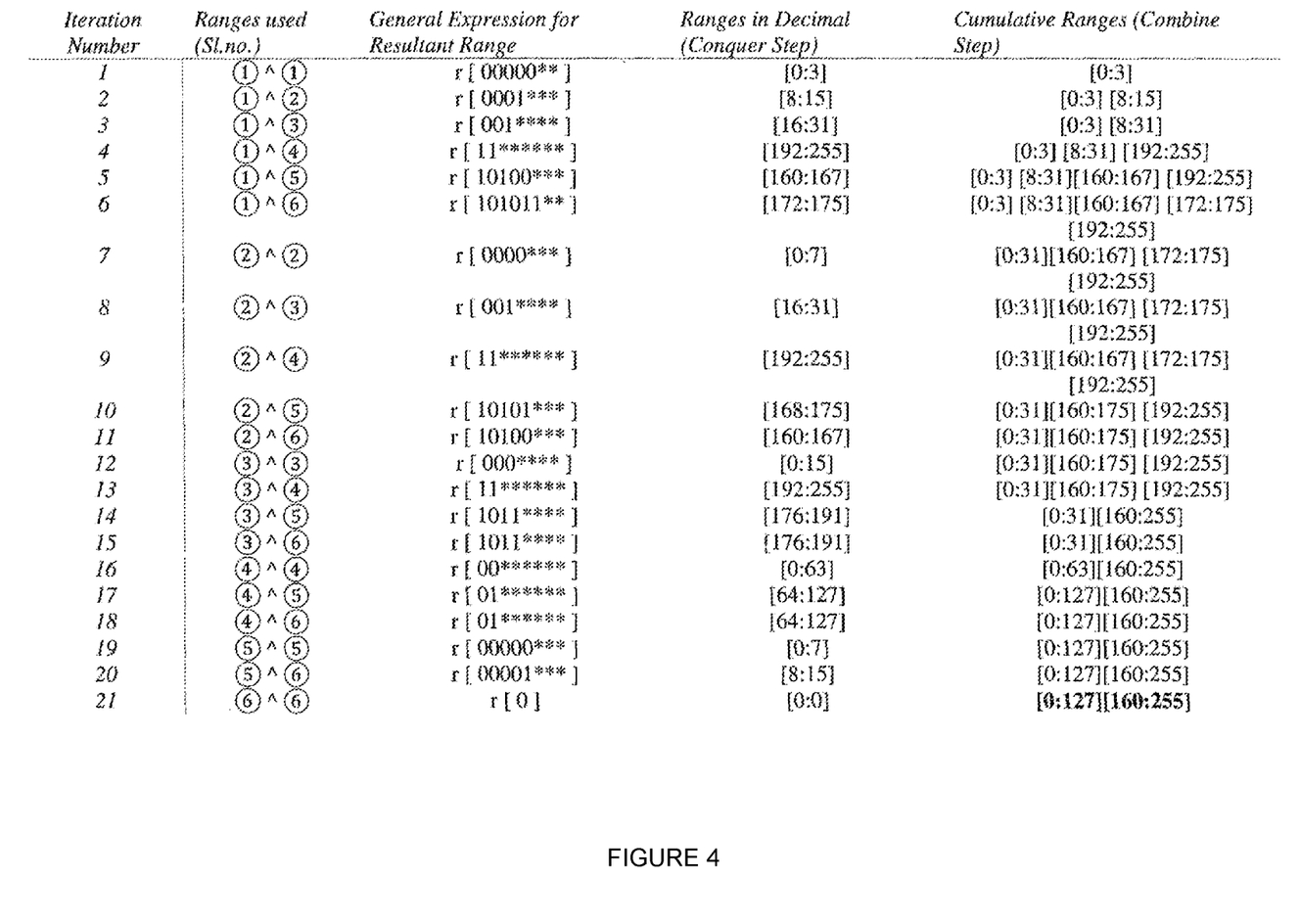
FIG. 4 shows a table depicting a bitwise XOR operation based on the constructed ranges associated with operands of the bitwise XOR operation, according to some examples.

FIG. 4 shows a table depicting a bitwise XOR operation based on the constructed ranges associated with operands of the bitwise XOR operation, according to some examples. The construed ranges, as shown in FIG. 1B, are used for every possible combination of an XOR bitwise operation to obtain the resultant range. For example, using the first range of 11001XX for the first operand with the first range of the second operand, which is the same in this case because both constraint ranges of operands "a" and "b" were selected to be the same for illustrative and nonlimiting purposes. Accordingly, the resultant range for the bitwise XOR operation for the combination of ranges 11001XX and 11001XX results in a 00000XX resultant subset. On the other hand, the bitwise XOR operation combination of first range for the "a" operand and the second range for the "b" operand, hence 11001XX and 1101XXX respectively, results in a 0001XXX resultant subset. Similarly, the bitwise XOR operation combination of the first range for the "a" operand and the third range for the "b" operand, hence 11001XX and 111XXXX respectively, results in a 001XXXX resultant subset. It is appreciated that the process is repeated for every possible combination for the constructed ranges in FIG. 1B. Accordingly, the table, as shown in FIG. 4, is constructed. The resultant range in decimal format may therefore be determined to be [0:127] and [160:255]. It is appreciated that similar to FIG. 2, the first bit portion of the subset of the resultant range may have consecutive bit orders, nonconsecutive bit orders, a different number of bits, different bit values, etc.

Figure 5:
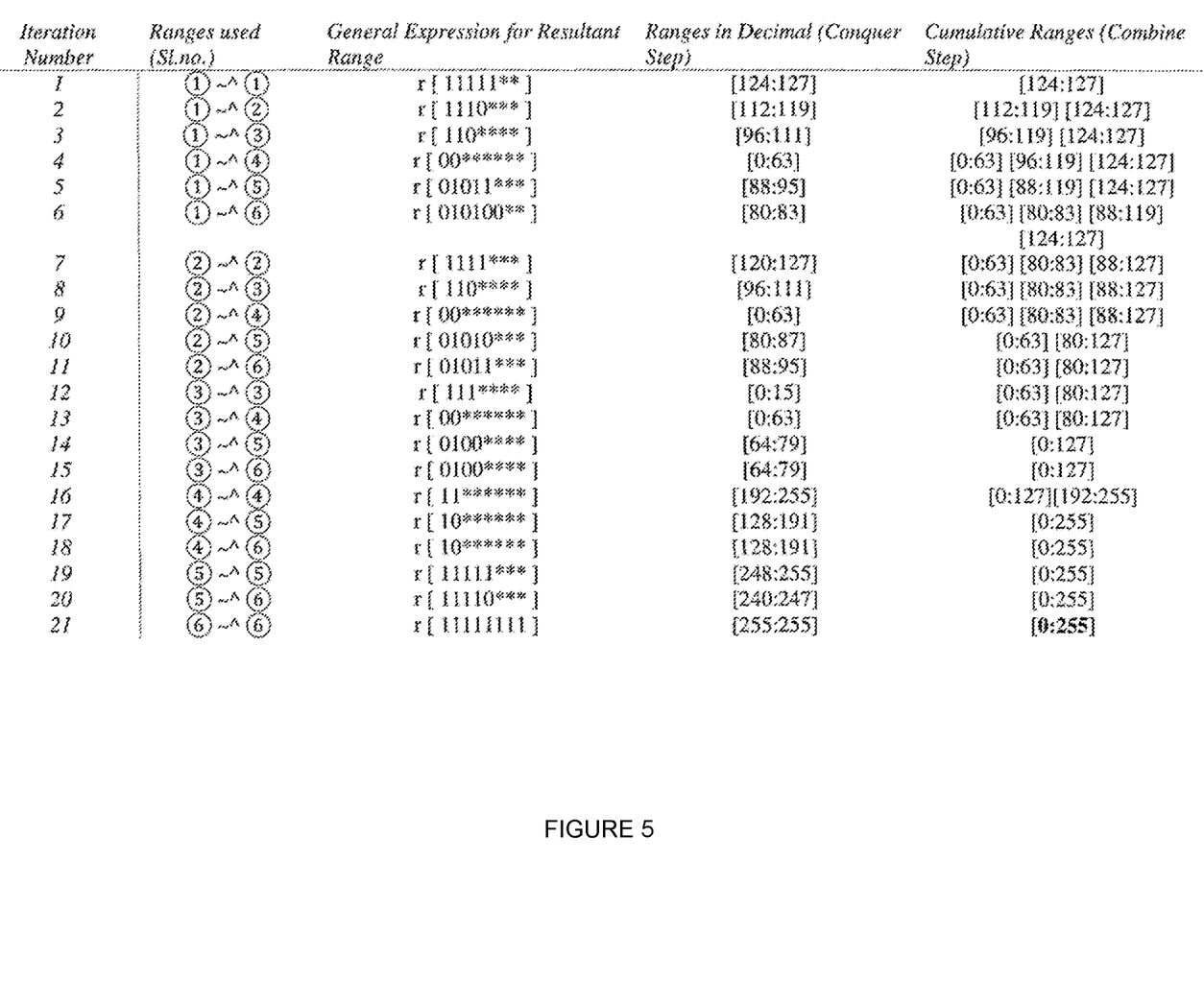
FIG. 5 shows a table depicting a bitwise XNOR operation based on the constructed ranges associated with operands of the bitwise XNOR operation, according to some examples.

FIG. 5 shows a table depicting a bitwise XNOR operation based on the constructed ranges associated with operands of the bitwise XNOR operation, according to some examples. The construed ranges, as shown in FIG. 1B, are used for every possible combination of an XNOR bitwise operation to obtain the resultant range. For example, using the first range 11001XX for the first operand with the first range of the second operand, which is the same in this case because both constraint ranges of operands "a" and "b" were selected to be the same for illustrative and nonlimiting purposes. Accordingly, the resultant range for the bitwise XNOR operation for the combination for range 11001XX and 11001XX results in a 11111XX resultant subset. On the other hand, the bitwise XNOR operation combination of first range for the "a" operand and the second range for the "b" operand, hence 11001XX and 1101XXX respectively, results in a 1110XXX resultant subset. Similarly, the bitwise XNOR operation combination of the first range for the "a" operand and the third range for the "b" operand, hence 11001XX and 111XXXX respectively, results in a110XXXX resultant subset. It is appreciated that the process is repeated for every possible combination for the constructed ranges in FIG. 1B. Accordingly, the table, as shown in FIG. 5, is constructed. The resultant range in decimal format may therefore be determined to be [0:255]. It is appreciated that similar to FIG. 2, the first bit portion of the subset of the resultant range may have consecutive bit orders, nonconsecutive bit orders, a different number of bits, different bit values, etc.

Figure 6:
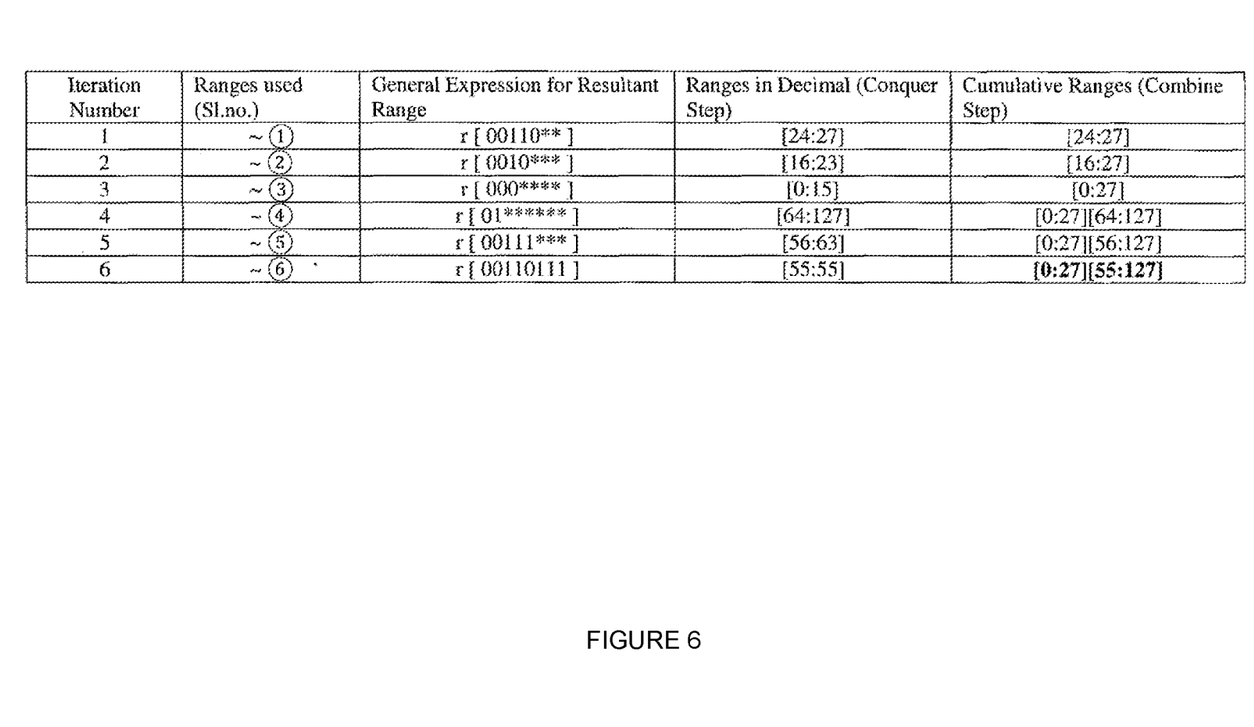
FIG. 6 shows a table depicting a bitwise NEGATION operation based on the constructed ranges associated with operands of the bitwise NEGATION operation, according to some examples.

FIG. 6 shows a table depicting a bitwise NEGATION operation based on the constructed ranges associated with operands of the bitwise NEGATION operation, according to some examples. It is appreciated that NEGATION is a unary operation. The ranges as shown in FIG. 1B for an operand may form the resultant ranges, as shown in FIG. 6, for a NEGATION bitwise operation. For example, the first range of an operand being 11001XX may be negated to form the resultant range 00110XX resultant subset. The second range of an operand being 1101XXX may be negated to form the resultant range 0010XXX resultant subset. The third range of an operand being 111XXXX may be negated to form the resultant range of 000XXXX resultant subset. The fourth range of an operand being 10XXXXXX may be negated to form the resultant range of 01XXXXXX resultant subset. The fifth range of an operand being 11000XXX may be negated to form the resultant range of 00111XXX resultant subset, and finally the sixth range of an operand being 11001000 may be negated to form the resultant range of 00110111 resultant subset. The resultant range in decimal format may therefore be determined to be [0:27] and [55:127]. It is appreciated that similar to FIG. 2, the first bit portion of the subset of the resultant range may have consecutive bit orders, nonconsecutive bit orders, a different number of bits, different bit values, etc.

As illustrated, the number of combinations and computations is significantly reduced because a range, with many element numbers, forms a plurality of ranges that is significantly less than the number of elements in the range.

Figure 7:
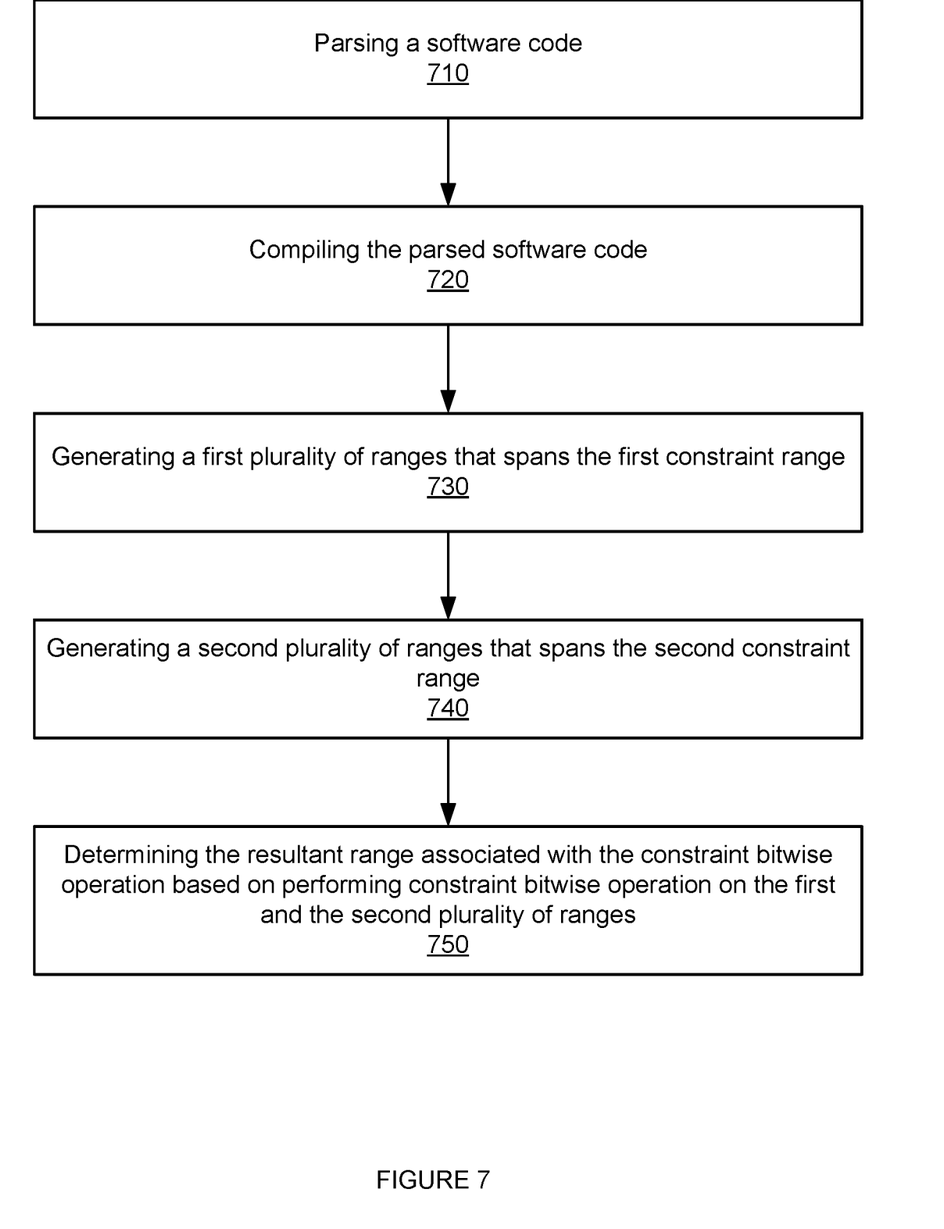
FIG. 7 shows a flow diagram for determining resultant range of a bitwise operation, according to some examples.

FIG. 7 shows a flow diagram for determining the resultant range of a bitwise operation, according to some examples, and as illustrated in FIGS. 1A-6. At step 710, a software code that includes a constraint bitwise operation with a first operand associated with a first constraint range and a second operand associated with a second constraint range, is parsed. At step 720, the parsed software code is compiled. At step 730, a first plurality of ranges that spans the first constraint range is generated. It is appreciated that each range of the first plurality of ranges has an upper bit portion and a lower bit portion. The upper bit portion for each range of the first plurality of ranges remains unchanged. At step 740, a second plurality of ranges that spans the second constraint range is generated. Each range of the second plurality of ranges has an upper bit portion and a lower bit portion. The upper bit portion for each range of the second plurality of ranges remains unchanged. At step 750, the resultant range associated with the constraint bitwise operation is determined based on performing the constraint bitwise operation on the first and the second plurality of ranges. In some embodiments, at step 750 the embodiment includes performing the constraint bitwise operation between each range from the first plurality of ranges and each range from the second plurality of ranges to generate a plurality of subset resultant ranges that forms the resultant range. Each subset resultant range of the plurality of subset resultant ranges includes a first bit portion and a second bit portion. The first bit portion remains unchanged for that subset resultant range.

Figure 8:
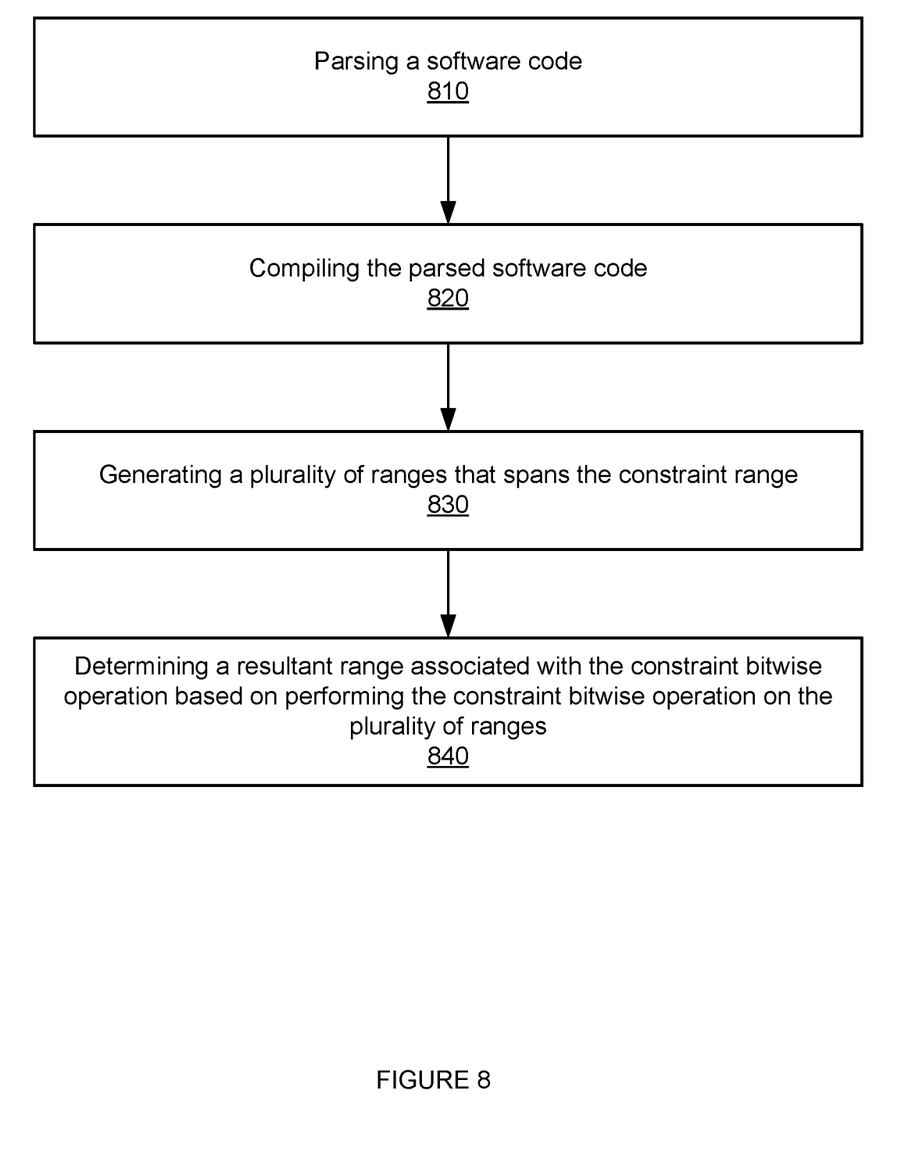
FIG. 8 shows another flow diagram for determining resultant range of a bitwise operation, according to some examples.

FIG. 8 shows another flow diagram for determining resultant range of a bitwise operation, according to some examples, as illustrated in FIGS. 1A-6. At step 810, a software code that includes a constraint bitwise operation with an operand associated with a constraint range, is parsed. At step 820, the parsed software code is compiled. At step 830, a plurality of ranges that spans the constraint range is generated. It is appreciated that each range of the plurality of ranges has an upper bit portion and a lower bit portion. The upper bit portion for each range of the plurality of ranges remains unchanged. At step 840, a resultant range associated with the constraint bitwise operation is determined based on performing the constraint bitwise operation on the plurality of ranges.

Figure 9:
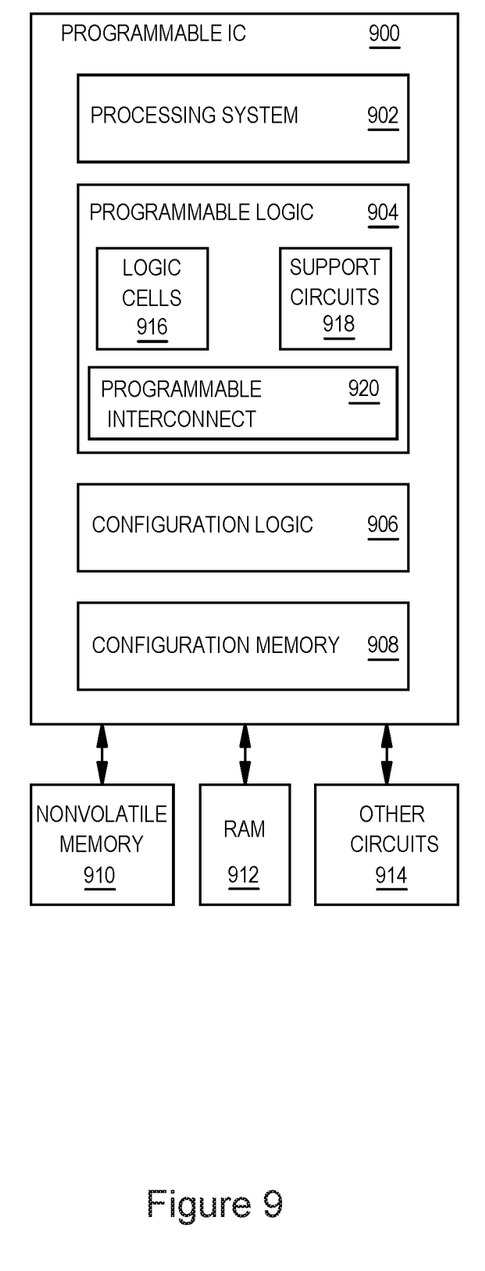
FIG. 9 is a block diagram depicting a programmable integrated circuit (IC), according to some examples.

FIG. 9 is a block diagram depicting a programmable integrated circuit (IC) 900 according to an example. The programmable IC 900 can implement the integrated circuit (IC) chip of systems of FIGS. 1A-8, in whole or in part. The programmable IC 900 includes a processing system 902, programmable logic 904, configuration logic 906, and configuration memory 908. The programmable IC 900 can be coupled to external circuits, such as nonvolatile memory 910, RAM 912, and other circuits 914.

In the example of FIG. 9, the processing system 902 can include microprocessor(s), memory, support circuits, IO circuits, and the like. The programmable logic 904 includes logic cells 916, support circuits 918, and programmable interconnect 920. The logic cells 916 include circuits that can be configured to implement general logic functions of a plurality of inputs. The support circuits 918 include dedicated circuits, such as transceivers, input/output blocks, digital signal processors, memories, and the like. The logic cells and the support circuits 918 can be interconnected using the programmable interconnect 920. Information for programming the logic cells 916, for setting parameters of the support circuits 918, and for programming the programmable interconnect 920 is stored in the configuration memory 908 by the configuration logic 906. The configuration logic 906 can obtain the configuration data from the nonvolatile memory 910 or any other source (e.g., the RAM 912 or from the other circuits 914).

Figure 10:
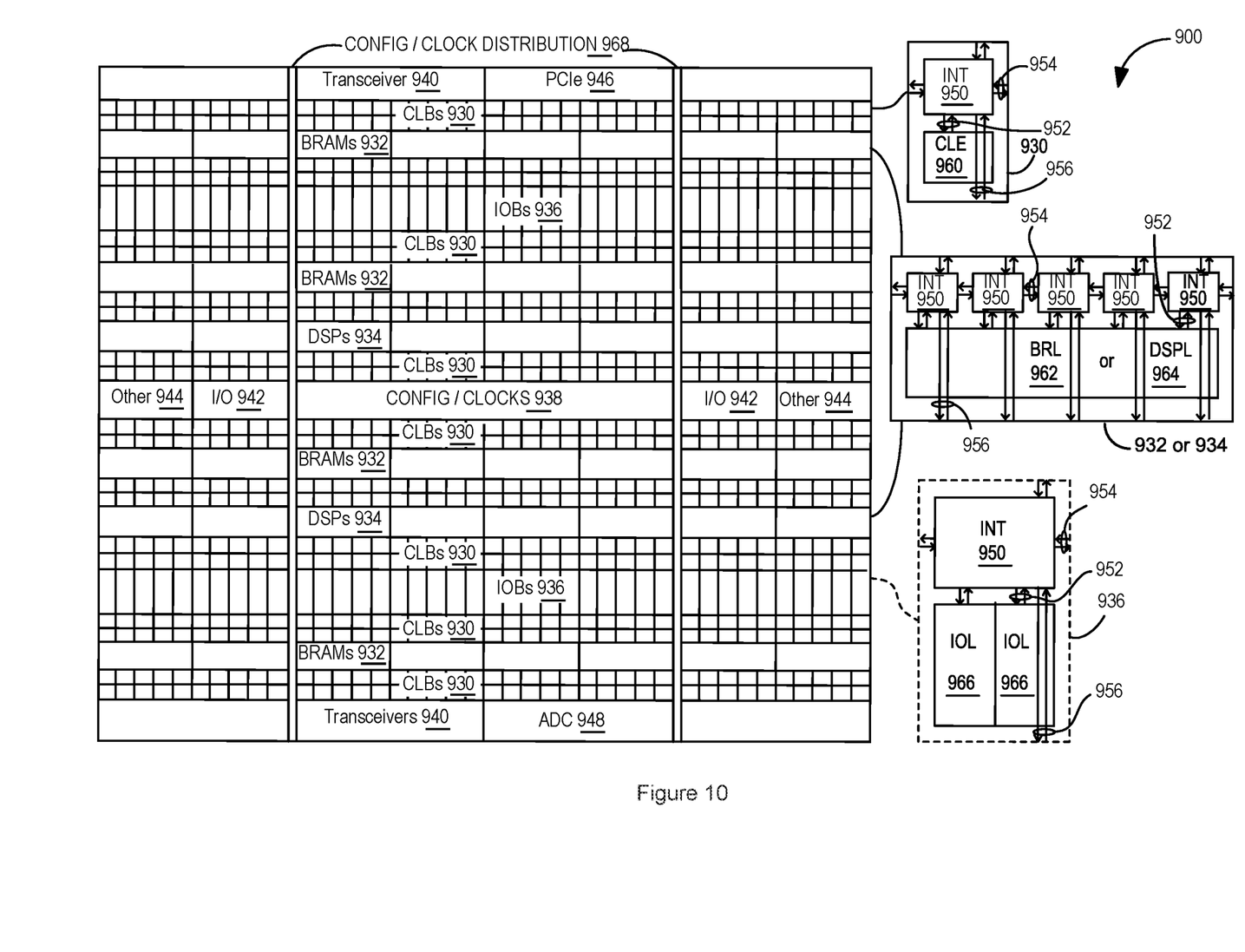
FIG. 10 is a field programmable gate array (FPGA) implementation of the programmable IC, according to some examples.

FIG. 10 illustrates an FPGA implementation of the programmable IC 900 that includes a large number of different programmable tiles including configurable logic blocks ("CLBs") 930, random access memory blocks ("BRAMs") 932, signal processing blocks ("DSPs") 934, input/output blocks ("IOBs") 936, configuration and clocking logic ("CONFIG/CLOCKS") 938, digital transceivers 940, specialized input/output blocks ("I/O") 942 (e.g., configuration ports and clock ports), and other programmable logic 944 such as digital clock managers, system monitoring logic, and so forth. The FPGA can also include PCIe interfaces 946, analog-to-digital converters (ADC) 948, and the like.

In some FPGAs, each programmable tile can include at least one programmable interconnect element ("INT") 950 having connections to input and output terminals 952 of a programmable logic element within the same tile, as shown by examples included in FIG. 6. Each programmable interconnect element 950 can also include connections to interconnect segments 954 of adjacent programmable interconnect element(s) in the same tile or other tile(s). Each programmable interconnect element 950 can also include connections to interconnect segments 956 of general routing resources between logic blocks (not shown). The general routing resources can include routing channels between logic blocks (not shown) comprising tracks of interconnect segments (e.g., interconnect segments 956) and switch blocks (not shown) for connecting interconnect segments. The interconnect segments of the general routing resources (e.g., interconnect segments 956) can span one or more logic blocks. The programmable interconnect elements 950 taken together with the general routing resources implement a programmable interconnect structure ("programmable interconnect") for the illustrated FPGA.

In an example implementation, a CLB 930 can include a configurable logic element ("CLE") 960 that can be programmed to implement user logic plus a single programmable interconnect element ("INT") 950. A BRAM 932 can include a BRAM logic element ("BRL") 962 in addition to one or more programmable interconnect elements. Typically, the number of interconnect elements included in a tile depends on the height of the tile. In the pictured example, a BRAM tile has the same height as five CLBs, but other numbers (e.g., four) can also be used. A signal processing block 934 can include a DSP logic element ("DSPL") 964 in addition to an appropriate number of programmable interconnect elements. An IOB 936 can include, for example, two instances of an input/output logic element ("IOL") 966 in addition to one instance of the programmable interconnect element 950. As will be clear to those of skill in the art, the actual I/O pads connected, for example, to the input/output logic element 966 typically are not confined to the area of the input/output logic element 966.

In the pictured example, a horizontal area near the center of the die is used for configuration, clock, and other control logic. Vertical columns 968 extending from this horizontal area or column are used to distribute the clocks and configuration signals across the breadth of the FPGA.

Some FPGAs utilizing the architecture illustrated in FIG. 6 include additional logic blocks that disrupt the regular columnar structure making up a large part of the FPGA. The additional logic blocks can be programmable blocks and/or dedicated logic.

Note that FIG. 10 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 10 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

While the foregoing is directed to specific examples, other and further examples may be devised without departing from the basic scope thereof, and the scope thereof is determined by the claims that follow.

What is claimed is:

1. A computer implemented method comprising:
    parsing a software code that includes a constraint bitwise operation with a first operand associated with a first constraint range and a second operand associated with a second constraint range;
    compiling the parsed software code;
    generating a first plurality of ranges that spans the first constraint range wherein each range of the first plurality of ranges has an upper bit portion and a lower bit portion, wherein the upper bit portion for the each range of the first plurality of ranges remains unchanged;
    generating a second plurality of ranges that spans the second constraint range wherein each range of the second plurality of ranges has an upper bit portion and a lower bit portion, wherein the upper bit portion for the each range of the second plurality of ranges remains unchanged; and
    determining a resultant range associated with the constraint bitwise operation based on performing the constraint bitwise operation on the first and the second plurality of ranges.

2. The computer implemented method of claim 1, wherein the first constraint range is different from the second constraint range.

3. The computer implemented method of claim 1, wherein the constraint bitwise operation is a logical operation.

4. The computer implemented method of claim 3, wherein the logical operation is an AND operation, an OR operation, an XOR operation, or an XNOR operation.

5. The computer implemented method of claim 1, wherein the software code is in a system Verilog format.

6. The computer implemented method of claim 1, wherein the upper bit portion of one range of the first plurality of ranges is different from the upper bit portion of another range of the first plurality of ranges.

7. The computer implemented method of claim 6, wherein a number of bits in the upper bit portion of the one range of the first plurality of ranges is different from a number of bits in the upper bit portion of the another range of the first plurality of ranges.

8. The computer implemented method of claim 6, wherein a number of bits in the upper bit portion of the one range of the first plurality of ranges is the same as a number of bits in the upper bit portion of the another range of the first plurality of ranges.

9. The computer implemented method of claim 1, wherein the determining comprises:
 performing the constraint bitwise operation between each range from the first plurality of ranges and each range from the second plurality of ranges to generate a plurality of subset resultant ranges that forms the resultant range, wherein each subset resultant range of the plurality of subset resultant ranges includes a first bit portion and a second bit portion, and wherein the first bit portion remains unchanged for that subset resultant range.

10. The computer implemented method of claim 9, wherein the first bit portion of a subset resultant range of the plurality of subset resultant ranges is different from the first bit portion of another subset resultant range of the plurality of subset resultant ranges.

11. The computer implemented method of claim 9, wherein the first bit portion of a subset resultant range of the plurality of subset resultant ranges includes consecutive bit orders.

12. The computer implemented method of claim 9, wherein the first bit portion of a subset resultant range of the plurality of subset resultant ranges includes nonconsecutive bit orders.

13. The computer implemented method of claim 9, wherein a number of bits in the first bit portion of a subset resultant range of the plurality of subset resultant ranges is different from a number of bits in the first bit portion of another subset resultant range of the plurality of subset resultant ranges.

14. The computer implemented method of claim 9, wherein the first bit portion of a subset resultant range of the plurality of subset resultant ranges includes at least one bit order that is absent from the first bit portion of another subset resultant range of the plurality of subset resultant ranges.

15. A computer implemented method comprising:
 parsing a software code that includes a constraint bitwise operation with an operand associated with a constraint range;
 compiling the parsed software code;
 generating a plurality of ranges that spans the constraint range wherein each range of the plurality of ranges has an upper bit portion and a lower bit portion, wherein the upper bit portion for the each range of the plurality of ranges remains unchanged; and
 determining a resultant range associated with the constraint bitwise operation based on performing the constraint bitwise operation on the plurality of ranges.

16. The computer implemented method of claim 15, wherein the constraint bitwise operation is a logical operation, and wherein the logical operation is a negation operation.

17. The computer implemented method of claim 15, wherein the software code is in a system Verilog format.

18. The computer implemented method of claim 15, wherein the upper bit portion of one range of the plurality of ranges is different from the upper bit portion of another range of the plurality of ranges.

19. The computer implemented method of claim 18, wherein a number of bits in the upper bit portion of the one range of the plurality of ranges is different from a number of bits in the upper bit portion of the another range of the plurality of ranges.

20. The computer implemented method of claim 18, wherein a number of bits in the upper bit portion of the one range of the plurality of ranges is the same as a number of bits in the upper bit portion of the another range of the plurality of ranges.

* * * * *